US010935616B2

(12) United States Patent
Lee et al.

(10) Patent No.: US 10,935,616 B2
(45) Date of Patent: Mar. 2, 2021

(54) MRI DATA PROCESSING METHOD FOR PROCESSING INFORMATION ON SUSCEPTIBILITY AND APPARATUS THEREFOR

(71) Applicant: Seoul National University R&DB Foundation, Seoul (KR)

(72) Inventors: Jongho Lee, Seoul (KR); Jin Gu Lee, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 397 days.

(21) Appl. No.: 15/880,707

(22) Filed: Jan. 26, 2018

(65) Prior Publication Data

US 2018/0292482 A1    Oct. 11, 2018

(30) Foreign Application Priority Data

Apr. 6, 2017    (KR) ........................ 10-2017-0044720

(51) Int. Cl.
*G01R 33/48*    (2006.01)
*G01R 33/56*    (2006.01)
*G01R 33/50*    (2006.01)

(52) U.S. Cl.
CPC ......... *G01R 33/4828* (2013.01); *G01R 33/50* (2013.01); *G01R 33/56* (2013.01); *G01R 33/5608* (2013.01)

(58) Field of Classification Search
None
See application file for complete search history.

(56) References Cited

U.S. PATENT DOCUMENTS

2009/0261824 A1    10/2009 Haacke et al.
2012/0321162 A1*   12/2012 Liu .................... G01R 33/5616
                                                            382/131

(Continued)

FOREIGN PATENT DOCUMENTS

JP    5902317 B2    3/2016

OTHER PUBLICATIONS

Liu et al. "Susceptibility-Weighted Imaging and Quantitative Susceptibility Mapping in the Brain" J. Magn Reson Imaging., Jul. 2015; Wiley Periodicals, Inc. 2014 (Year: 2014).*

(Continued)

*Primary Examiner* — Roy Y Yi
(74) *Attorney, Agent, or Firm* — Stuart H. Mayer; Mayer & Williams PC

(57) ABSTRACT

Provided is an MRI data processing method for determining a positive contribution level for susceptibility by more than one or more different materials with susceptibility greater than the susceptibility of the reference material and a negative contribution level for susceptibility by one or more different materials with susceptibility smaller than the susceptibility of the reference material. The method includes calculating a first value regarding the frequency of the MRI signal of the measurement target, obtaining a second value regarding a relaxation constant of the MRI signal, and finding the solutions of the first independent variable and the second independent variable when the first dependent variable of the function having the positive contribution level for susceptibility as a first independent variable and the negative contribution level for susceptibility as a second independent variable has the first value and the second dependent variable of the function has the second value.

15 Claims, 7 Drawing Sheets

(56) References Cited

U.S. PATENT DOCUMENTS

2014/0142417 A1 5/2014 Reeder et al.
2015/0002148 A1 1/2015 Liu

OTHER PUBLICATIONS

Turner et al. ("Functional magnetic resonance imaging of the human brain: data acquisition and analysis" Exp. Brain Res (1998) 123, p. 5-12) (Year: 1998).*

Schweser et al., "SEMI-TWInS: Simultaneous Extraction of Myelin and Iron using a T2*-Weighted Imaging Sequence" Proc. Intl. Soc. Mag. Reson. Med. 19 (2011) p. 120.

Langkammer et al., "Susceptibility induced gray-white matter MRI contrast in the human brain" NeuroImage 59 (2012) 1413-1419.

Schweser, et al., "Disentangling contributions from iron and myelin architecture to brain tissue magnetic susceptibility by using Quantitative Susceptibility Mapping (QSM)" Proc. Intl. Soc. Mag. Reson. Med. 20 (2012), p. 409.

Stüber et al., "Myelin and iron concentration in the human brain: A quantitative study of MRI contrast" NeuroImage 93 (2014) 95-106.

Xu Li, et al. "Magnetic Susceptibility Contrast Variations in Multiple Sclerosis Lesions" Journal of Magnetic Resonance maging, Feb. 2016 vol. 43, No. 2, pp. 463-473.

Marques, et al. "Studying cyto and myeloarchitecture of the human cortex at ultra-high field with quantitative imaging: R1, R2 and magnetic suspectibility" NeuroImage 147(2017) 152-163.

Zhang et al., "Quantitative Susceptibility Mapping and R2* Measured Changes during White Matter Lesion Development in Multiple Sclerosis: Myelin Breakdown, Myelin Debris Degradation and Removal, and Iron 4ccumulation" AJMR. Am J Neuroradiol 37:1629-35) Sep. 2016.

Ropele, et al. "Iron Mapping in Multiple Sclerosis" Neuroimage Clin N Am 27 (2017) 335-342.

* cited by examiner

FIG. 2A
$X_{total}$
FIG. 2B
$X_{positive}$
FIG. 2C
$X_{negative}$
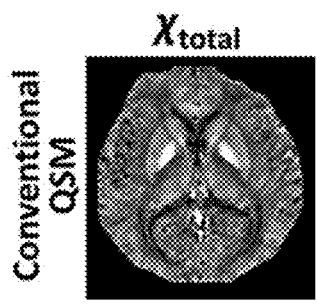
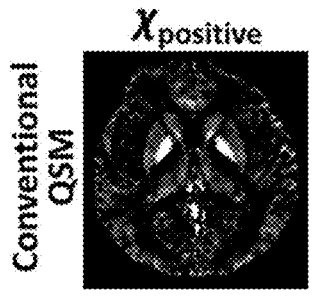
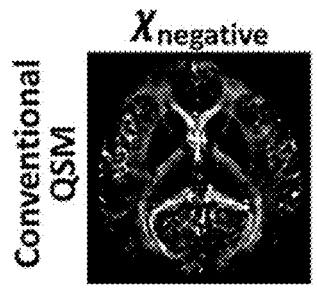
FIG. 2D
$X_{total}$
FIG. 2E
$X_{positive}$
FIG. 2F
$X_{negative}$
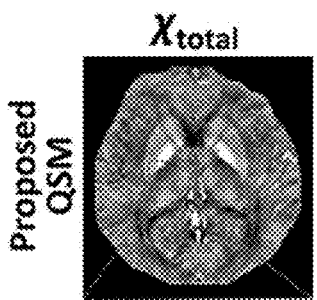
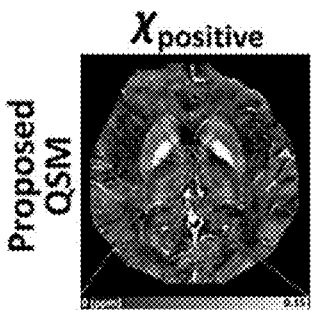
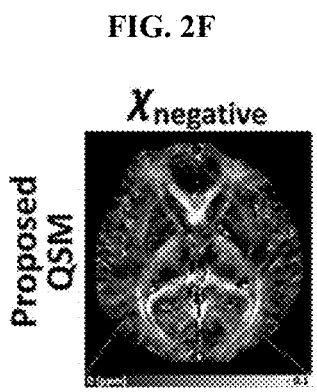
FIG. 2G
$X_{total}$
FIG. 2H
$X_{positive}$
FIG. 2I
$X_{negative}$
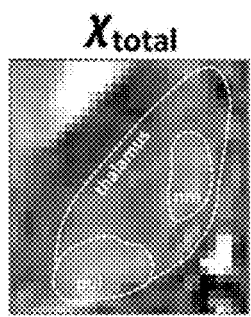
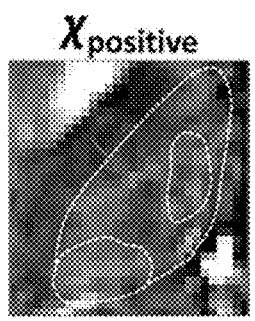
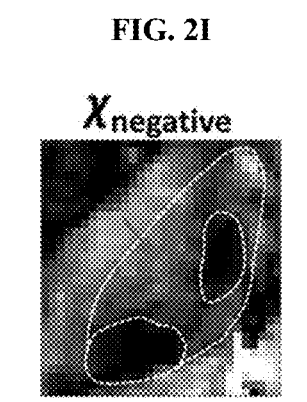

Slice 1

$\chi_{negative}$

Slice 2

$\chi_{negative}$

Slice 1

Myelin water imaging

Slice 2

Myelin water imaging

MRI DATA PROCESSING METHOD FOR PROCESSING INFORMATION ON SUSCEPTIBILITY AND APPARATUS THEREFOR

CROSS-REFERENCE TO RELATED APPLICATION

This application claims priority to Korean Patent Application No. 10-2017-0044720 filed on Apr. 6, 2017 and all the benefits accruing therefrom under 35 U.S.C. § 119, the contents of which are incorporated by reference in their entirety.

FUNDING STATEMENT

This invention was supported by the Brain Research Program through the National Research Foundation of Korea (NRF) funded by the Ministry of Science, ICT & Future Planning (NRF-2015M3C7A1031969) and Creative-Pioneering Researchers Program through Seoul National University (SNU).

BACKGROUND

The present invention relates to an MRI apparatus and an MRI data processing technique, and more particularly to a technique for processing susceptibility (magnetic susceptibility) information.

<Magnetic Field and Susceptibility>

A material may have a physical property called susceptibility (magnetic susceptibility), and its value may vary for each substance. Susceptibility may have a value of a real-number range. That is, any material may have a susceptibility of +, 0, or −.

When a material is placed in a magnetic field, if the magnetization of the material is aligned along the direction of the magnetic field, the susceptibility of the material may be defined as having a positive value. Conversely, when the magnetization of the material is aligned along the opposite direction of the magnetic field, the susceptibility of the material may be defined as having a negative value. At this time, it may be defined that as the tendency to align along the direction of the magnetic field or the opposite direction is larger, the absolute value of susceptibility becomes larger.

According to the above definition of susceptibility, for example, the susceptibility of iron and magnet has a positive value, and the susceptibility of a nerve myelin sheath has a negative value.

Example of MRI Operation Mode

MRI is based on nuclear magnetic resonance (NMR). Some nuclei may absorb and release radio frequency energy when placed in an external magnetic field. Hydrogen atoms are naturally abundant in the anatomy to be tested and are most often used to generate radio frequency signals. The radio wave pulses excite the nuclear-spin energy transition so as to allow the atomic nucleus to absorb energy and the energy is again received through a reception antenna. Magnetic field gradients localize the received signal in space. By varying the parameters of the pulse sequence, different contrasts between the tissues may be generated based on the relaxation properties of the hydrogen atoms.

According to an embodiment, the degree of magnetization of a reference material (e.g., water) may be measured by using MRI. Hydrogen nuclei contained in water are magnetized by applying a large magnetic field. 'Magnetization' or 'magnetic polarization' is a vector field that represents the density of a permanent magnetic-dipole moment or the density of an induced magnetic-dipole-moment. Thus, the magnetization may be a vector having magnitude and phase. Therefore, the term 'magnetization' may be replaced with 'magnetization vector' in the present specification.

In addition, the magnetization vector not only explains how the material reacts by the applied magnetic field, but also describes how the material changes the magnetic field. The magnetization vector may usually be defined as the amount of magnetic moment per unit volume.

When using MRI according to an embodiment of the present invention, a volumetric measurement target may be divided, for example, into units having a volume of 1 mm*1 mm*2 mm and observed. Herein, each unit may be referred to as 'voxel'.

In the present specification, the 'measurement target' may be an object to be measured using an MRI apparatus, for example, a living person or an animal tissue. At this time, the measurement target may contain water and other materials. In an embodiment, the MRI apparatus may be to measure a signal originating from the water. Therefore, the concept of "an MRI apparatus measures a signal generated from a measurement target" may be understood as a substitution of the concept of "an MRI apparatus measures a signal generated from water contained in the measurement target."

<Influence of Measurement Target on Magnetic Field>

The basic magnetic field B0 provided by the MRI apparatus serves to cause magnetic polarization of the hydrogen nuclei. Hereinafter, for convenience of explanation, it is assumed that the basic magnetic field B0 is directed to the + direction of the z axis, for example.

When the measurement target is disposed in the basic magnetic field B0, the magnetic field in the measurement target may be changed by materials having non-zero susceptibility included in the measurement target. That is, the magnitude of the magnetic field in the measurement target may have a different value from the basic magnetic field B0. At this time, when the measurement target is divided into a plurality of voxels, the sum of the susceptibility of the substances contained in each voxel may be different for each voxel. Therefore, the average magnitude values of the magnetic fields in each voxel in the measurement target may be different from each other.

<Relation Between Rotation Frequency of Magnetization Vector of Measurement Target Voxel and Susceptibility of Measurement Target Voxel>

Now, when an RF excitation signal, i.e., an RF pulse, is applied to the measurement target, as the magnetization vector aligned so as to have the same direction as the direction (=+z-axis direction) of the basic magnetic field B0 is gradually tilted with respect to the z-axis, the tilted magnetization vector is rotated around the z axis as a rotation center. Hereinafter, in the present invention, the tilted motion is referred to as a mutation, and the rotational motion may be referred to as a precession.

By the precession, the magnetization vector of the nucleus may be rotated R times for 1 second around the z axis. R is a value indicating a rotation frequency of the precession of the magnetization vector, and this value may have a positive real number value, and the value of R is related to the magnitude of the magnetic field in the space occupied by the nucleus. The magnitude of the magnetic field may have a different value from the basic magnetic field B0 as described above.

Further, the rotation frequency is related to a change rate of the phase of the magnetization vector with time. Here, the phase may mean an angle between a projection vector that is projected when the magnetization vector that performs the precession is projected on an orthogonal plane (e.g., an x-y plane) orthogonal to the basic magnetic field B0 and an arbitrary reference axis (e.g., a y-axis or x-axis) on the orthogonal plane. That is, when the specific magnetization vector is continuously measured, the phase of the specific magnetization vector may be measured at each measurement time. Therefore, a graph or data showing values of the phase of the specific magnetization vector with respect to time may be obtained. By using the graph or data, the rotation frequency according to the precession of the specific magnetization vector may be measured. That is, the rotation frequency of the precession of the specific magnetization vector may be obtained from the information on the phases measured at each time.

As a parameter related to the projection vector, a parameter R2, R2*, or R2' is a parameter indicating a rate of change (relaxation rate) of the size of the projection vector with time.

As described above, the measurement target (e.g., tissue of an organism) may be measured in voxel units. At this time, since a plurality of atoms are included in each defined voxel, a plurality of magnetization vectors may exist. Therefore, the vector sum of the magnetization vectors included in the specific voxel may be referred to as an 'integrated magnetization vector' of the specific voxel or a 'magnetization vector summation' of the specific voxel. The integrated magnetization vector of the specific voxel may also perform the precession. In this case, the time-dependent change of the phase observed according to the precession of the integrated magnetization vector of the specific voxel may not be represented by only a single frequency component. Nevertheless, the rotation frequency according to the precession of the integrated magnetization vector of the specific voxel may be defined. As a result, the magnetic field B0+ΔB in each voxel may be measured. The magnetic field B0+ΔB may have a different value for each voxel.

Since the basic magnetic field B0 is a predetermined value, a difference value ΔB between the basic magnetic field B0 and the measured magnetic field B0+ΔB may be calculated for each voxel. It may be easily understood that a difference value ΔB may be different for each voxel. A difference value ΔB calculated from a specific voxel may have a correlation with respect to the sum of the susceptibility of the materials contained in the specific voxel. For example, a difference value ΔB calculated from a specific voxel may be proportional to the sum of the susceptibility of the materials contained in the specific voxel.

<Relaxation Constant of Magnetization Vector of Measurement Target Voxel>

In an embodiment of the present invention, rather than observing each magnetization vector of the individual hydrogen nuclei contained in the measurement target, the above-described integrated magnetization vector, defined as the vector sum of the magnetization vectors of the hydrogen nuclei contained in the defined voxel, is observed for each voxel.

At this time, in the 'initial state' before the RF excitation signal is applied to the measurement target, the magnetization vectors in the specific voxel are aligned in the same direction as the basic magnetic field B0. Therefore, the magnitude of the integrated magnetization vector in the specific voxel may have a relatively large value.

However, after the RF excitation signal is applied, each magnetization vector in the specific voxel may perform precession and mutation with degrees of freedom. Therefore, the cancellation between the individual magnetization vectors in the specific voxel occurs, so that the magnitude of the integrated magnetization vector of the specific voxel tends to decrease with time.

The reduction rate indicating the degree of relaxation over time may be referred to as the relaxation constant of the magnitude signal of the integrated magnetization vector of the particular voxel. In the art, as an example of the relaxation constant, a parameter commonly referred to as R2, R2*, or R2' is used in the field of MRI technology.

The magnitude of the integrated magnetization vector of the specific voxel and the phase according to the precession of the integrated magnetization vector may be measured by a conventional art.

Definition of Terms

Herein, in the present specification, 'positive susceptibility of a material' or 'excessive susceptibility of a material' means a difference between the susceptibility of the reference material and the susceptibility of the material when the susceptibility of the material is higher than the susceptibility of the reference material (e.g., water).

In a preferred embodiment, the excessive susceptibility may be specified to have zero or positive sign. However, in other embodiments, the excessive susceptibility may be specified to have a zero or negative sign.

Herein, in the present specification, 'insufficient susceptibility of a material' or 'negative susceptibility of a material' means a difference between the susceptibility of the reference material and the susceptibility of the material when the susceptibility of the material is lower than the susceptibility of the reference material.

In a preferred embodiment, the insufficient susceptibility may be specified to have zero or negative sign. However, in other embodiments, the insufficient susceptibility may be specified to have a zero or positive sign.

In this specification, 'excessive susceptibility contribution level of any material' or 'additional susceptibility contribution level of any material' or 'susceptibility excessive contribution level of any material' or 'positive contribution level for susceptibility of any material' may refer to the sum or integral of the excessive susceptibility of any material defined above contained in a predetermined set of voxels. That is, the 'excessive susceptibility contribution level of a material' may mean a value that is obtained by multiplying the excessive susceptibility of the material described above by a value proportional to the density or amount of the material contained in the predetermined set of voxels. In a preferred embodiment, the predetermined set of voxels may include only one voxel.

In a preferred embodiment, the excessive susceptibility contribution level of any material may be specified to have a zero or positive sign. However, in another embodiment, the sign of the excessive susceptibility contribution level may be defined to have 0 or a negative sign.

In this specification, 'insufficient susceptibility contribution level of any material' or 'negative contribution level for susceptibility of any material' or 'the negative contribution level for susceptibility of any material' may mean the sum or integral of the insufficient susceptibility of the above-defined any material contained in a predetermined set of voxels. That is, 'the insufficient susceptibility contribution level of a material' may mean a value that is obtained by multiplying the insufficient susceptibility of the material described above by a value proportional to the density or amount of the material contained in the predetermined set of voxels. In a preferred embodiment, the predetermined set of voxels may include only one voxel.

In a preferred embodiment, the insufficient susceptibility contribution level of any material may be specified to have a zero or negative sign. However, in other embodiments, the insufficient susceptibility contribution level may be specified to have a zero or positive sign.

The contents described in the technical background of the invention recognized in this specification relate to the contents necessary for understanding the core idea of the present invention and are not intended to be recognized as the conventional art.

SUMMARY

It is an object of the present invention to provide a method of distinguishing and determining information on the distribution of a material (hereinafter, simply referred to as a first domain material) having susceptibility greater than the susceptibility of the reference material (e.g., water) and information on the distribution of a material (hereinafter simply referred to as a second domain material) having susceptibility smaller than the susceptibility of the reference material among the various materials included in the measurement target (e.g., tissue of an organism).

That is, the present invention provides a technique for generating a first map indicating a distribution of the first domain material in the measurement target and/or a second map indicating a distribution of the second domain material in the measurement target.

In the present invention, the first map may be referred to as a 'first susceptibility map' or a 'first susceptibility data' or an 'excessive susceptibility map', and the second map may be referred to as a 'second susceptibility map' or 'second susceptibility data' or 'insufficient susceptibility map'.

The measurement target may be an animal's brain or other body organs of an animal but is not limited thereto. Measurement for the measurement target may be performed using MRI.

The 'material' referred to in the 'first domain material' and the 'second domain material' described in the present specification is a collective representation of one kind of material or two or more different kinds of materials. For example, 'first domain material' may refer to collectively encompassing one material or a plurality of different materials in the present specification.

There is no reliable technique for distinguishing data corresponding to the first susceptibility map and data corresponding to the second susceptibility map according to the conventional art. That is, according to the conventional art, there is a problem that the distribution of the first domain material and the distribution of the second domain materials may not be reliably distinguished from each other in a state in which the first domain material and the second domain materials coexist in one space.

Now, a measurement target may be placed in the space where the basic magnetic field B0 applied by the MRI apparatus exists. If the measurement target includes materials having susceptibility greater or less than the susceptibility of the reference material (e.g., water), the basic magnetic field B0 is affected by the measurement target in the space occupied by the measurement target. For example, if iron with positive susceptibility and/or a nerve myelin sheath with negative susceptibility is included in the measurement target, the magnetic field B0+ΔB in each voxel of the measurement target may be different from the basic magnetic field B0. As a result, the rotation frequency due to the precession of the integrated magnetization vector of each voxel is affected.

According to one aspect of the present invention, the MRI data processing method according to the present invention is provided to calculate the value of the negative contribution level for susceptibility by the second domain material present in the specific voxel of a specific object and the value of the positive contribution level for susceptibility by the first domain material. This MRI data processing method may use equations 1 and 2.

$$y = f1(x+, x-),\qquad \text{[Equation 1]}$$

where y is a value derived from a value regarding the phase of the MRI signal for voxel or a value regarding the phase of the MRI signal for voxel, and x+, x− are two unknown parameters regarding voxel and have different signs.

$$z = g1(x+, x-),\qquad \text{[Equation 2]}$$

where z is a value derived from a value regarding the magnitude of the MRI signal for voxel or a value regarding the magnitude of the MRI signal for voxel, and x+, x− are two unknown parameters regarding voxel and have different signs.

In equations 1 and 2, preferably, x+ may be a positive contribution level for susceptibility $\chi_{pos\_R}$ due to first domain materials included in the voxel, and x− may be a negative contribution level for susceptibility $\chi_{neg\_R}$ by the second domain materials included in the voxel.

y and z are measurable values using an MRI apparatus.

Preferably, the MRI signal in the equations 1 and 2 may be a time-dependent measurement value of the integrated magnetization vector of the voxel described above.

The functions f1 ( ) and g1 ( ) shown in equation 1 and equation 2 are functions capable of finding solutions of x+ and x−.

Preferably, y may be a frequency-shift value Δf representing a difference value between the rotation frequency and the basic frequency according to the precession of the integrated magnetization vector of the voxel.

Preferably, z may be the relaxation value (R2'=R2*−R2) of the magnitude signal of the integrated magnetization vector of the voxel.

Preferably, f1 ( ) is a function that multiplies or convolates a value obtained by adding x+ and x− by a first constant, and g1( ) may be a function that multiplies or convolates a value obtained by adding the absolute value of x+ and the absolute value of x− by a second constant. The first constant may be a dipole kernel $D_p$, and the second constant may be a magnitude relaxation kernel $D_m$.

Preferably, x+ may be a positive contribution level for susceptibility $\chi_{pos\_R}$ by the first domain materials included in the voxel.

Preferably, x− may be a negative contribution level for susceptibility) $\chi_{neg\_R}$ by the second domain materials included in the voxel.

The above equations 1 and 2 may be binary first-order simultaneous equations.

The time-dependent value of the integrated magnetization vector measured for the voxel may be obtained. Equation 1 shows that the measurement value of the rotation frequency according to the precession of the integrated magnetization vector obtained based on the time-dependent value of the integrated magnetization vector is influenced by the first domain material and the second domain material existing in the voxel. The equation shows that the degree of influence is proportional to the frequency-shift value ΔB, which is a difference value between the measurement value of the rotation frequency and the basic frequency B0.

In equation 1, the left side represents the frequency-shift value ΔB in the voxel observable by the MRI, and the right side represents the value obtained by multiplying the values of the positive contribution level x+ for susceptibility and the negative contribution level x− for susceptibility by the material contained in the voxel by the dipole kernel $D_p$.

According to another aspect of the present invention, an MRI data acquisition method can be provided for calculating a negative contribution level for susceptibility by the second domain material existing in n voxels of a measurement target and a positive contribution level for susceptibility by the first domain material. This MRI data acquisition method may use equations 3 and 4.

$$y=[y1,y2,y3,\ldots,yn]=f2(x1+,x1-,x2+,x2-,x3+,x3-,\ldots,xn+,xn-) \quad \text{[Equation 3]}$$

where yk is a value regarding the phase of the MRI signal with respect to the voxel of the index k among n voxels or the phase of the MRI signal (k=1, 2, 3, . . . , and n), and xk+ and xk− are two unknown parameters regarding the voxel of the index k among n voxels (k=1, 2, 3, . . . , and n).

$$z=[z1,z2,z3,\ldots,zn]=g2(x1+,x1-,x2+,x2-,x3+,x3-,\ldots,xn+,xn-) \quad \text{[Equation 4]}$$

where zk is a value regarding the magnitude of the MRI signal with respect to the voxel of the index k among n voxels or a value regarding the magnitude of the MRI signal (k=1, 2, 3, . . . , and n), and xk+ and xk− are two unknown parameters regarding the voxel of the index k among n voxels (k=1, 2, 3, . . . , and n).

y and z are measurable values using an MRI apparatus.

Preferably, the MRI signal in the equations 3 and 4 may be a time-dependent measurement value of the integrated magnetization vector of a specific voxel.

The functions f2( ) and g2( ) shown in equation 3 and equation 4 are functions that find the solution of the unknowns xk+ and xk− (k=1, 2, 3, . . . , and n).

Preferably, yk may be a frequency-shift value Δf representing a difference value between the rotation frequency and the basic frequency according to the precession of the integrated magnetization vector of the voxel of the index k (k=1, 2, 3, . . . , and n).

y is a set of data measured for n voxels and is a 'voxel-specific frequency-shift value set' representing a difference value between the rotation frequency and the basic frequency B0 according to the precession of the integrated magnetization vector of each voxel of the MRI measurement target.

A first data set for phase parameters may be measured and stored for each voxel by MRI.

Preferably, zk may be the relaxation value (R2'=R2*−R2) of the magnitude signal of the integrated magnetization vector of the voxel of the index k (k=1, 2, 3, . . . , and n).

z is a set of data measured for n voxels and may be referred to as a 'voxel-specific relaxation value set' that represents the relaxation value of the magnitude signal of the integrated magnetization vector of each voxel of the MRI measurement target.

Preferably, f2( ) is a function having n pairs of xk+ and xk− as arguments, and g2( ) is a function having n pairs of absolute values of xk+ and xk− as arguments (k=1, 2, 3, . . . , and n).

Preferably, xk+ may be a value regarding a positive contribution level $\chi_{pos\_R}$ for susceptibility by first domain materials included in the voxel of the index k.

Preferably, xk− may be a value regarding a negative contribution level $\chi_{neg\_R}$ for susceptibility by second domain materials included in the voxel of the index k.

The equation 3 and equation 4 may be polygonal first-order simultaneous equations.

Quantitative susceptibility mapping (QSM) according to the conventional art has been proposed as a tool for measuring the amount of magnetic susceptibility sources in the brain where both a source (e.g., iron) of relatively positive susceptibility and a source (e.g., nerve myelin sheath) of relatively negative susceptibility with respect to water exist. Until now, the QSM according to the conventional art may measure an average susceptibility value but may not separate a source having positive susceptibility and a source having negative susceptibility coexisting in one voxel.

The present invention relates to a new QSM algorithm for generating a first susceptibility map and a second susceptibility map.

In an embodiment of the present invention, the 'first susceptibility map' means, for example, information indicating the amount of the first domain material having susceptibility greater than the reference material among the materials included in each voxel of the brain to be observed or the 'susceptibility contribution level' of the corresponding material by each voxel and, and the 'second susceptibility map' means, for example, information indicating the amount of the second domain material having susceptibility less than the reference material among the materials included in each voxel of the brain to be observed or the 'susceptibility contribution level' of the corresponding material by each voxel.

When in a magnetic field, susceptibility sources cause magnetic field perturbations. This phenomenon may be formulated and expressed by the following equation 5.

$$f=D_p*\chi \quad \text{[Equation 5]}$$

In equation 5, f represents a frequency shift due to magnetic field disturbance, $D_p$ represents a so-called dipole kernel, and x represents susceptibility. Equation 5 may be re-presented as equation 6 below when the susceptibility is identified according to their signs of the sources.

$$f=D_p*(\chi_{pos\_R}+\chi_{neg\_R}) \quad \text{[Equation 6]}$$

In equation 6, $\chi_{pos\_R}$ represents a value obtained by subtracting the reference susceptibility from the susceptibility of the first domain material with susceptibility greater than the reference susceptibility of the reference material (e.g., water), and $\chi_{neg\_R}$ represents a value obtained by subtracting the reference susceptibility from the susceptibility of the second domain material having susceptibility smaller than the reference susceptibility of the reference material.

If the reference material is water, for example, the frequency shift f in equation 5 may represent a value shifted from the frequency of the MRI signal measured by water.

According to equation 6, if a first domain material having greater susceptibility than the reference material and a second domain material having smaller susceptibility coexist in a voxel, compared with the case where only the first domain material having greater susceptibility than the reference material is present or only the second domain material having smaller susceptibility than the reference material exists, it may be understood that the absolute value of the magnitude of the frequency shift f will be larger.

R2'(=R2*−R2) representing the magnitude signal relaxation may be considered to be affected by the absolute value of the susceptibility amount, and this phenomenon may be formulated as the following equation 7.

$$R2' = D_m * (|\chi_{pos\_R}| + |\chi_{neg\_R}|) \quad \text{[Equation 7]}$$

According to an embodiment, R2' in equation 7 may be replaced by R2 or R2*.

In equation 7, $D_m$ represents a magnitude relaxation kernel.

R2 represents the original signal relaxation rate of the material in MRI, and R2* represents the signal relaxation rate of the material when the magnetic field in the material is non-uniform in MRI. At this time, a difference value between R2* and R2 may be seen to be caused by the phenomenon that the susceptibility of the material changes the basic magnetic field of the MRI. Therefore, a model in which R2', which is a difference value between R2* and R2, is proportional to the sum of the absolute value of each susceptibility by the first domain material and the second domain material may be provided, and equation 7 reflects this model.

In equation 7, it is assumed that the susceptibility sources are farther apart from each other, and that R2' changes linearly with respect to the absolute value of susceptibility.

In equation 7, the magnitude relaxation kernel is assumed to be a delta function. That is, the effect of susceptibility to R2' is localized in one voxel. The size of the magnitude relaxation kernel may be, for example, 124 Hz/ppm.

Considering both the frequency shift and the signal magnitude relaxation, a new QSM algorithm according to the present invention may be expressed by equation 8 below.

$$\operatorname{argmin} \chi_{pos\_R}, \chi_{neg\_R} |(R2' + i2\pi f) - D_m*(|\chi_{pos\_R}| + |\chi_{neg\_R}|) - i2\pi D_p*(\chi_{pos\_R} + \chi_{neg\_R})| + \lambda g(\chi_{pos\_R}, \chi_{neg\_R}) \quad \text{[Equation 8]}$$

Here, $g(\chi_{pos\_R}, \chi_{neg\_R})$, as an optical term and a regularization term, is to reduce streaking artifacts. Then, $\lambda$ is a regularization factor. The solution of equation 8 may be found iteratively by sequentially updating $\chi_{pos\_R}$ and $\chi_{neg\_R}$ using a conjugate gradient.

[Simulation]

A geometric phantom and a Zubal phantom were utilized to test the algorithm according to an embodiment of the present invention. Referring to FIG. 1, the corresponding contribution R2' is assigned to the positive contribution level for susceptibility and the negative contribution level for susceptibility.

FIG. 1A shows a true susceptibility map using a geometric phantom.

FIG. 1B shows the susceptibility map reconstructed by QSM using geometric phantom.

FIG. 1C shows a true susceptibility map using a Zubal phantom.

FIG. 1D shows the susceptibility map reconstructed by QSM using a Zubal phantom.

FIGS. 1E and 1F show R2' and a phase map using a geometric phantom, respectively.

FIGS. 1G and 1H show R2' and a phase map using a Zubal phantom, respectively.

EXPERIMENT

Data was acquired at 3T and GRE was obtained: At this time, FOV=192*192*120 mm³, voxel size=1*1*2 mm³, TR=53 mm, and TE=3.71:5.8:28.51 ms.

To estimate R2', an R2 map was obtained using a multi-echo spin-echo: At this time, the field of view (FOV) and the resolution are the same as Gradient Recalled-Echo (GRE), TR=5160 ms, and TE=30:30:90 ms.

To compare the second susceptibility map to the nerve myelin sheath concentration map, an additional GRE for gradient-echo nerve myelin sheath water imaging (GRE-MWI) was obtained. At this time, FOV=208*256*48 mm³, voxel size=2*2*2 mm³, TR=56 mm, and TE=2.4:2.2:34.8 ms.

To estimate the R2' map, R2* (and R2) maps were generated by mono-exponential fitting on multi-echo data.

After removal of the background field, a frequency shift map was calculated from the GRE.

For comparison, QSM and GRE-MWI according to the conventional art were generated.

As a result of the phantom study, through the method according to an embodiment of the present invention, by separating positive susceptibility sources with respect to a reference material coexisting in one voxel and negative susceptibility sources with respect to the reference material, susceptibility is successfully reconstituted (see FIG. 1; $R^2 > 0.99$).

FIG. 2A shows the entire susceptibility map estimated by QSM according to the conventional art.

FIG. 2B shows the first susceptibility map estimated by QSM according to the conventional art.

FIG. 2C shows the second susceptibility map estimated by QSM according to the conventional art.

FIG. 2D shows the entire susceptibility map estimated by QSM according to an embodiment of the present invention.

FIG. 2E shows the first susceptibility map estimated by QSM according to an embodiment of the present invention.

FIG. 2F shows the second susceptibility map estimated by QSM according to an embodiment of the present invention.

FIG. 2G shows the entire susceptibility map of thalamus estimated by QSM according to an embodiment of the present invention.

FIG. 2H shows the first susceptibility map of thalamus estimated by QSM according to an embodiment of the present invention.

FIG. 2I shows the second susceptibility map of thalamus estimated by QSM according to an embodiment of the present invention.

According to the in-vivo data, the total susceptibility map by the QSM proposed according to an embodiment of the present invention is similar to the susceptibility distribution of the QSM map according to the conventional art, as shown in FIG. 2 (see FIGS. 2A and 2D). On the other hand, voxels containing both positive susceptibility sources for the reference material and negative susceptibility sources for the reference material are revealed only by the proposed method according to an embodiment of the present invention (see FIG. 2B, FIG. 2C, FIG. 2E, and FIG. 2F). The first susceptibility map by the proposed QSM according to an embodiment of the present invention reveals a moderate susceptibility concentration in white matter (see FIG. 2B and FIG. 2E). The enlarged area shown in FIG. 2G, FIG. 2H, and FIG. 2I represents thalamus, and this includes well-known pulvinar (pul) and nucleus medialis (nm), which are rich in iron but lack the nerve myelin sheath. These sub-thalamic regions are only delineated by the $\chi_{neg\_R}$ reconstruction through the method provided according to an embodiment of the present invention. The remaining portion of the thalamus reveals the coexistence of the positive susceptibility sources for the reference material and the negative susceptibility sources (arrows) for the reference material, which are previously reported.

In FIG. 3, a first susceptibility map based on the proposed QSM according to an embodiment of the present invention is compared to a map of iron concentration, which is confirmed from the documents of several ROIs. The iron concentration is verified for several known zones as the first susceptibility map implemented by the present invention is compared with the iron concentration, which is a representative source of positive susceptibility, The Region Of Interest (ROI) values by the method according to an embodiment of the present invention show a strong linear relationship ($R^2=0.92$) with the document values containing the white matter ROIs. On the other hand, the QSM according to the conventional art shows a lower $R^2$ (=0.73), and shows substantially underestimated susceptibility within the white matter ROIs, It is most likely due to nerve myelin sheath with non-isolated negative susceptibility.

FIG. 4A shows a second susceptibility map for slice 1, which is generated according to an embodiment of the present invention.

FIG. 4B shows a second susceptibility map for slice 2, which is generated according to an embodiment of the present invention.

FIG. 4C shows a nerve myelin sheath concentration map for slice 1, obtained from nerve myelin sheath water imaging.

FIG. 4D shows a nerve myelin sheath concentration map for slice 2, obtained from nerve myelin sheath water imaging.

Referring to FIG. 4, when comparing the second susceptibility map and the nerve myelin sheath concentration map from GRE-MWI, they are very similar to each other and this indicates that nerve myelin sheath susceptibility has a significant contribution to the second susceptibility map.

In one embodiment of the present invention, the susceptibility may be isotropic susceptibility.

According to an embodiment of the present invention, R2 must be obtained in order to estimate R2'.

According to an embodiment of the present invention, an MRI data processing method can be provided for determining the positive contribution level ($\chi_{pos\_R}$) for susceptibility by more than one or more different materials with susceptibility greater than the susceptibility ($\chi(M_R)$) of the reference material ($M_R$) and the negative contribution level ($\chi_{neg\_R}$) for susceptibility by one or more different materials with susceptibility smaller than the susceptibility of the reference material. This processing method includes calculating a first value regarding the frequency of the MRI signal of the measurement target, obtaining a second value regarding a relaxation constant of the MRI signal, and finding the solutions of the first independent variable $\chi_{pos\_R}$ and the second independent variable $\chi_{neg\_R}$ when the first dependent variable y1 of the function F having the positive contribution level for susceptibility as a first independent variable $\chi_{pos\_R}$ and the negative contribution level for susceptibility as a second independent variable $\chi_{neg\_R}$ has the first value and the second dependent variable y2 of the function F has the second value.

At this point, the first value regarding the frequency of the MRI signal of the measurement target is a frequency-shift value Δf, which is a difference value between the resonance frequency of the MRI signal measured from the measurement target and the basic resonance frequency, i.e., the MRI resonance frequency of the reference material.

At this time, the function F may be given as (y1, y2)=F ($\chi_{pos\_R}$, $\chi_{neg\_R}$).

In this case, the first value may be the frequency-shift value, and the second value may be any one of R2, R2', and R2*.

At this time, the function F includes a first function f1 having the first independent variable $\chi_{pos\_R}$ and the second independent variable $\chi_{neg\_R}$ as dependent variables and having the first dependent variable y1 as a dependent variable, and a second function f2 having the first independent variable $\chi_{pos\_R}$ and the second independent variable $\chi_{neg\_R}$ as independent variables and having the second dependent variable y2 as a dependent variable. Then, a relationship between the first function f1, the first dependent variable y1, the first independent variable $\chi_{pos\_R}$, and the second independent variable $\chi_{neg\_R}$ may be given as equation 9, and a relationship between the second function f2, the second dependent variable y2, the first independent variable $\chi_{pos\_R}$, and the second independent variable $\chi_{neg\_R}$ may be given as equation 10.

$$y1 = f1(\chi_{pos\_R}, \chi_{neg\_R}) \quad \text{[Equation 9]}$$

$$y2 = f2(\chi_{pos\_R}, \chi_{neg\_R}) \quad \text{[Equation 10]}$$

At this time, the relationship between the second function f2, the second dependent variable y2, the first dependent variable $\chi_{pos\_R}$, and the second independent variable $\chi_{neg\_R}$ may be given as equation 11.

$$y2 = f2(|\chi_{pos\_R}|, |\chi_{neg\_R}|) \quad \text{[Equation 11]}$$

At this time, when one or more different materials with greater susceptibility include p-type first domain materials ($M_{p,a}$, a=1, 2, 3, . . . , p) and one or more different materials having smaller susceptibility include q-type second domain materials ($M_{n,b}$, b=1, 2, 3, . . . , q), the positive contribution level for susceptibility ($\chi_{pos\_R}$), and the negative contribution level for susceptibility ($\chi_{neg\_R}$) are given as equation 12 and equation 13, respectively.

$$X_{pos\_R} \overset{p}{\underset{a=1}{Q}} = \chi_R(M_{p,a}) * \rho(M_{p,a}), a = 1, 2, 3, \ldots, p \quad \text{[Equation 12]}$$

$$X_{neg\_R} \overset{q}{\underset{b=1}{Q}} = \chi_R(M_{n,b}) * \rho(M_{n,b}), b = 1, 2, 3, \ldots, q \quad \text{[Equation 13]}$$

where, $\chi_R(M_{p,a})$ is a value obtained by subtracting the susceptibility ($\chi(M_R)$) of the reference material from the susceptibility ($\chi(M_{p,a})$) of the first domain material ($M_{p,a}$), $\chi_R(M_{n,b})$ is a value obtained by subtracting the susceptibility ($\chi(M_R)$) of the reference material from the susceptibility ($\chi(M_{n,b})$) of the second domain material ($M_{n,b}$), $\rho_j(M_{p,a})$ is a density of the first domain material ($M_{p,a}$), and $\rho_j(M_{n,b})$ is a density of the second domain material ($M_{n,b}$).

According to another aspect of the present invention, an MRI data processing method can be provided for determining the positive contribution level for susceptibility $\chi_{pos\_R}$ by one or more different materials with susceptibility greater than the susceptibility $\chi(M_R)$ of the reference material $M_R$ and the negative contribution level for susceptibility $\chi_{neg\_R}$ by one or more different materials with susceptibility smaller than the susceptibility of the reference material, for each of the N voxels of the measurement target. This processing method includes: calculating a first value $Vf_j$ regarding the frequency of the MRI signal measured from each voxel; obtaining, for each voxel, a second value $Vd_j$ regarding a relaxation constant of the MIll signal measured from the voxel; and when each element y1$_j$ of the first dependent variable vector y1 of the second function Fm, which has the positive contribution level for susceptibility $\chi_{pos\_R,j}$ for the N voxels as a first independent variable set and the negative contribution level for susceptibility $\chi_{neg\_R,j}$ for the N voxels as a second independent variable set, has the first value Vf$_j$ calculated for each voxel, and each element y2$_j$ of the second dependent variable vector y2 of the second function Fm has the second value Vd$_j$ calculated for each voxel, finding the solutions of the first independent variable set and the second independent variable set. Here, j=1, 2, 3, . . . , N.

At this point, the first value Vf$_j$ regarding the frequency of the MRI signal measured from the voxel may be a frequency-shift value Δf$_j$, which is a difference value between the resonance frequency of the MRI signal measured from the voxel and the basic resonance frequency, i.e., the MRI resonance frequency of the reference material.

At this time, the second function Fm may be given as (y1, y2)=Fm($\chi_{pos\_R,1}$, $\chi_{pos\_R,2}$, $\chi_{pos\_R,3}$, . . . , $\chi_{pos\_R,N}$, $\chi_{neg\_R,1}$, $\chi_{neg\_R,2}$, $\chi_{neg\_R,3}$, . . . , $\chi_{neg\_R,N}$).

In this case, the first value Vf$_j$ may be the frequency-shift value Δf$_j$, and the second value Vd$_j$ may be any one of R2, R2', and R2*.

At this time, the second function Fm includes a first function Fm1 having the first independent variable set $\chi_{pos\_R,j}$ and the second independent variable set $\chi_{neg\_R,j}$ as independent variables and having the first dependent variable y1 as a dependent variable, and a second function Fm2 having the first independent variable $\chi_{pos\_R,j}$ and the second independent variable $\chi_{neg\_R,j}$ as independent variables and having the second dependent variable y2 as a dependent variable. Then, a relationship between the first function Fm1, the first dependent variable y1, the first independent variable set $\chi_{pos\_R,j}$, and the second independent variable set $\chi_{neg\_R,j}$ is given as equation 14, and a relationship between the second function Fm2, the second dependent variable vector y2, the first independent variable set $\chi_{pos\_R,j}$ and the second independent variable set $\chi_{neg\_R,j}$ may be given as equation 15.

$$y1 = Fm1(\chi_{pos\_R,1}, \chi_{pos\_R,2}, \chi_{pos\_R,3}, \ldots, \chi_{pos\_R,N}, \chi_{neg\_R,1}, \chi_{neg\_R,2}, \chi_{neg\_R,3}, \ldots, \chi_{neg\_R,N})$$ [Equation 14]

$$y2 = Fm2(\chi_{pos\_R,1}, \chi_{pos\_R,2}, \chi_{pos\_R,3}, \ldots, \chi_{pos\_R,N}, \chi_{neg\_R,1}, \chi_{neg\_R,2}, \chi_{neg\_R,3}, \ldots, \chi_{neg\_R,N})$$ [Equation 15]

At this time, then, the relationship between the second function Fm2, the second dependent variable vector y2, the first independent variable set $\chi_{pos\_R,j}$, and the second independent variable set $\chi_{neg\_R,j}$ may be given as equation 16.

$$y2 = Fm2(|\chi_{pos\_R,1}|, |\chi_{pos\_R,2}|, |\chi_{pos\_R,3}|, \ldots, |\chi_{pos\_R,N}|, |\chi_{neg\_R,1}|, |\chi_{neg\_R,2}|, |\chi_{neg\_R,3}|, \ldots, |\chi_{neg\_R,N}|)$$ [Equation 16]

At this time, when one or more different materials with greater susceptibility include p-type first domain materials (M$_{p,a}$, a=1, 2, 3, . . . , p) and one or more different materials having smaller susceptibility include q-type second domain materials (M$_{n,b}$, b=1, 2, 3, . . . , q), the positive contribution level $\chi_{pos\_R,j}$ for susceptibility with respect to each voxel, and the negative contribution level $\chi_{neg\_R,j}$ for susceptibility with respect to each voxel are given as equation 17 and equation 18, respectively.

$$X_{pos\_R,j} \overset{p}{\underset{a=1}{Q}} = \chi_R(M_{p,a}) * \rho_j(M_{p,a}),$$ [Equation 17]

$$a = 1, 2, 3, \ldots, p$$

$$X_{neg\_R,j} \overset{q}{\underset{b=1}{Q}} = \chi_R(M_{n,b}) * \rho_j(M_{n,b}),$$ [Equation 18]

$$b = 1, 2, 3, \ldots, q$$

where, $\chi_R(M_{p,a})$ is a value obtained by subtracting the susceptibility $\chi(M_R)$ of the reference material from the susceptibility $\chi(M_{p,a})$ of the first domain material (M$_{p,a}$), $\chi_R(M_{n,b})$ is a value obtained by subtracting the susceptibility $\chi(M_R)$ of the reference material from the susceptibility $\chi(M_{n,b})$ of the second domain material (M$_{n,b}$), $\rho_j(M_{p,a})$ is the density of the first domain material M$_{p,a}$ at voxel j, and $\rho_j(M_{n,b})$ is the density of the second domain material M$_{n,b}$ at voxel j.

According to another aspect of the present invention, a computing device can be provided for determining the positive contribution level ($\chi_{pos\_R}$) for susceptibility by more than one or more different materials with susceptibility greater than the susceptibility ($\chi(M_R)$) of the reference material (M$_R$) and the negative contribution level ($\chi_{neg\_R}$) for susceptibility by one or more different materials with susceptibility smaller than the susceptibility of the reference material. The computing device may be configured to calculate a first value regarding the frequency of the Mill signal of the measurement target, obtain a second value regarding a relaxation constant of the MRI signal, and find the solutions of the first independent variable $\chi_{pos\_R}$ and the second independent variable $\chi_{neg\_R}$ when the first dependent variable y1 of the function F having the positive contribution level for susceptibility as a first independent variable $\chi_{neg\_R}$ and the negative contribution level for susceptibility as a second independent variable $\chi_{neg\_R}$ has the first value and the second dependent variable y2 of the function F has the second value.

At this point, the first value regarding the frequency of the MRI signal of the measurement target is a frequency-shift value Δf, which is a difference value between the resonance frequency of the MRI signal measured from the measurement target and the basic resonance frequency, i.e., the MRI resonance frequency of the reference material.

According to another embodiment of the present invention, provided is a computer-readable recording medium having a program recorded thereon to cause the computing device to determine the positive contribution level for susceptibility $\chi_{pos\_R}$ by one or more different materials with susceptibility greater than the susceptibility $\chi(M_R)$ of the reference material M$_R$ and the negative contribution level for susceptibility $\chi_{neg\_R}$ by one or more different materials with susceptibility smaller than the susceptibility of the reference material. The program may be executed by the computing device to perform operations of calculating a first value regarding the frequency of the MRI signal of the measurement target, obtaining a second value regarding a relaxation constant of the MRI signal, and finding the solutions of the first independent variable $\chi_{pos\_R}$ and the second independent variable $\chi_{neg\_R}$ when the first dependent variable y1 of the function F having the positive contribution level for susceptibility as a first independent variable $\chi_{pos\_R}$ and the negative contribution level for susceptibility as a second independent variable $\chi_{neg\_R}$ has the first value and the second dependent variable y2 of the function F has the second value.

At this point, the first value regarding the frequency of the MRI signal of the measurement target may be a frequency-shift value Δf, which is a difference value between the resonance frequency of the MRI signal measured from the measurement target and the basic resonance frequency, i.e., the MRI resonance frequency of the reference material.

BRIEF DESCRIPTION OF THE DRAWINGS

Exemplary embodiments can be understood in more detail from the following description taken in conjunction with the accompanying drawings, in which:

FIG. 2A shows the entire susceptibility map estimated by QSM according to the conventional art.

FIG. 2B shows the first susceptibility map estimated by QSM according to the conventional art.

FIG. 2C shows the second susceptibility map estimated by QSM according to the conventional art.

FIG. 2D shows the entire susceptibility map estimated by QSM according to an embodiment of the present invention.

FIG. 2E shows the first susceptibility map estimated by QSM according to an embodiment of the present invention.

FIG. 2F shows the second susceptibility map estimated by QSM according to an embodiment of the present invention.

FIG. 2G shows the entire susceptibility map of sagittal estimated by QSM according to an embodiment of the present invention.

FIG. 2H shows the first susceptibility map of sagittal estimated by QSM according to an embodiment of the present invention.

FIG. 2I shows the second susceptibility map of sagittal estimated by QSM according to an embodiment of the present invention.

DETAILED DESCRIPTION OF EMBODIMENTS

Hereinafter, embodiments of the present invention will be described with reference to the accompanying drawings. However, the present invention is not limited to the embodiments described herein, but may be implemented in various other forms. The terminology used herein is for the purpose of understanding the embodiments and is not intended to limit the scope of the present invention. In addition, the singular forms used below include plural forms unless the phrases expressly have the opposite meaning.

It is an object of the present invention to provide a method of distinguishing and determining information on the distribution of a material (hereinafter, simply referred to as a first domain material) having susceptibility greater than the susceptibility of the reference material (e.g., water) and information on the distribution of a material (hereinafter simply referred to as a second domain material) having susceptibility smaller than the susceptibility of the reference material among the various materials included in the measurement target (e.g., tissue of an organism).

Embodiment 1

Figure 1A:
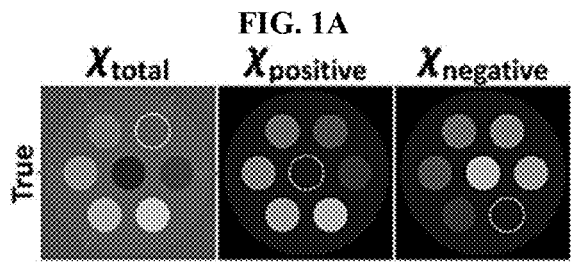
FIG. 1A shows a true susceptibility map using a geometric phantom.
Figure 1E:
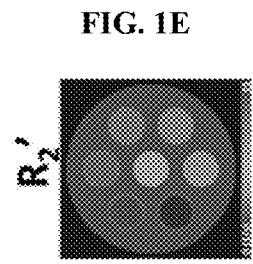
FIG. 1E and FIG. 1F show R2' and a phase map using a geometric phantom, respectively.
Figure 1B:
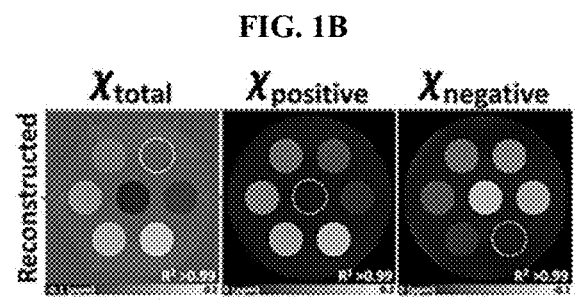
FIG. 1B shows the susceptibility map reconstructed by QSM using geometric phantom.
Figure 1F:
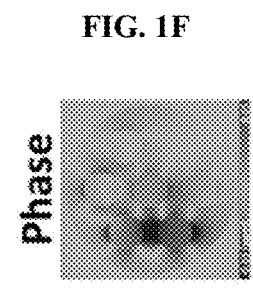
Figure 1C:
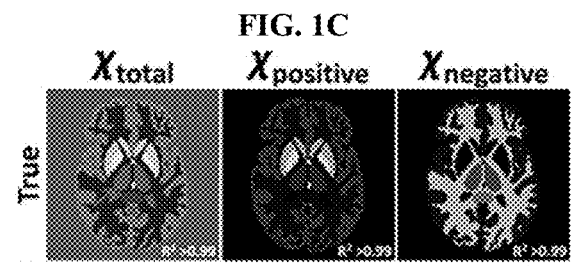
FIG. 1C shows a true susceptibility map using a Zubal phantom.
Figure 1G:
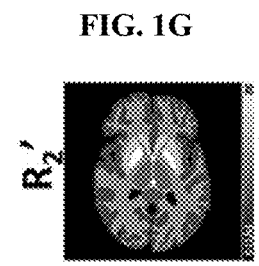
FIG. 1G and FIG. 1H show R2' and a phase map using a Zubal phantom, respectively.
Figure 1D:
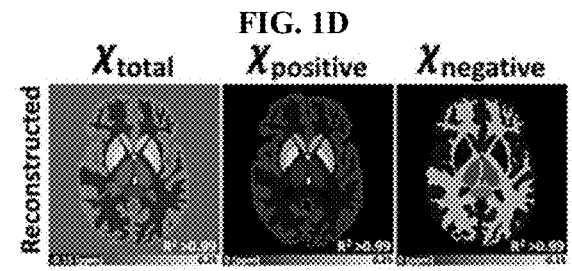
FIG. 1D shows the susceptibility map reconstructed by QSM using a Zubal phantom.
Figure 1H:
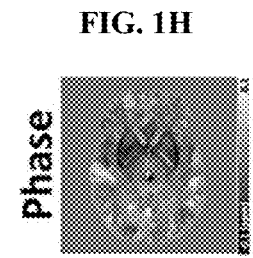
Figure 3:
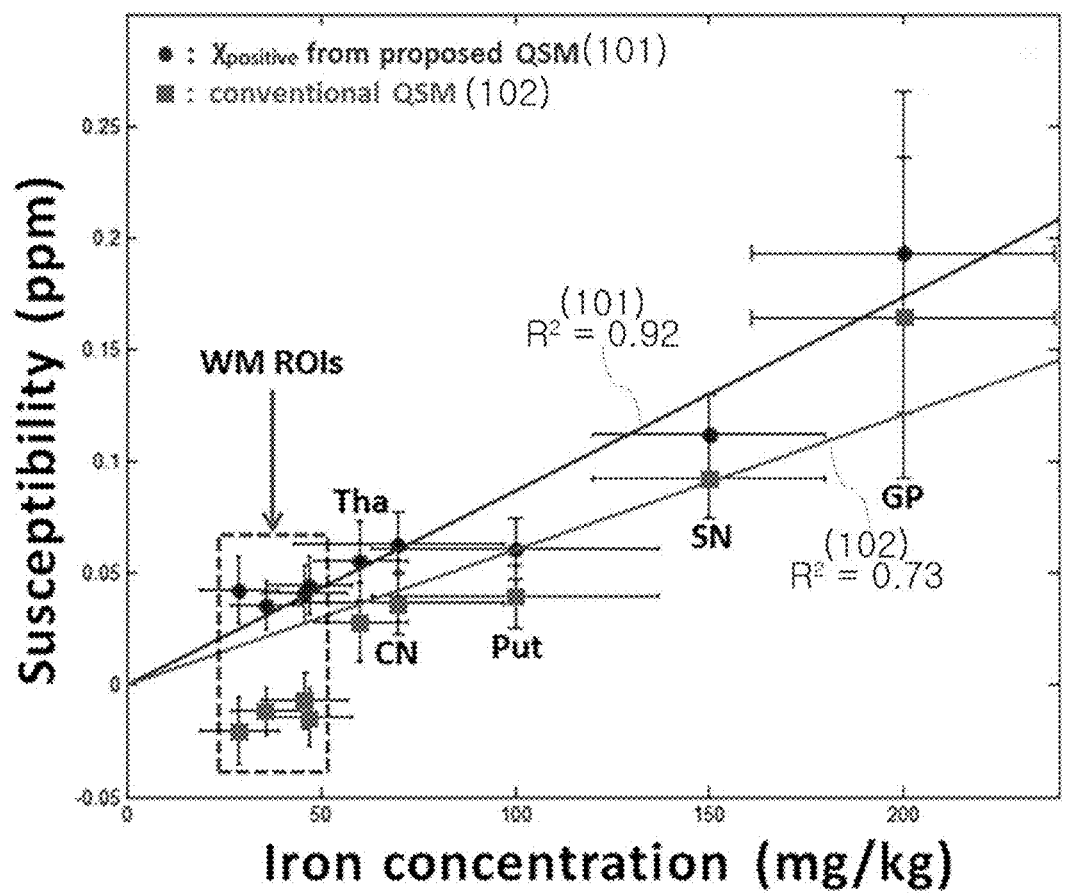
FIG. 3 shows a comparison between a first susceptibility map based on the proposed QSM according to an embodiment of the present invention and a map of iron concentration from the documents of several ROIs.
Figure 4A:
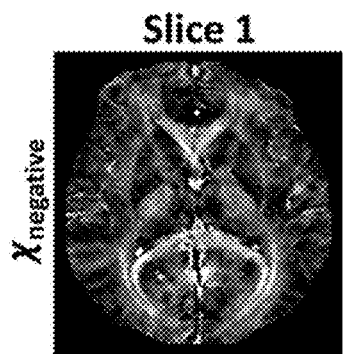
FIG. 4A shows a second susceptibility map for slice 1, which is generated according to an embodiment of the present invention.
Figure 4B:
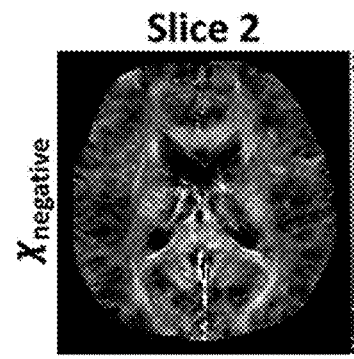
FIG. 4B shows a second susceptibility map for slice 2, which is generated according to an embodiment of the present invention.
Figure 4C:
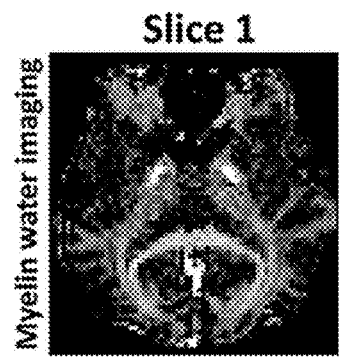
FIG. 4C shows a nerve myelin sheath concentration map for slice 1, obtained from nerve myelin sheath water imaging.
Figure 4D:
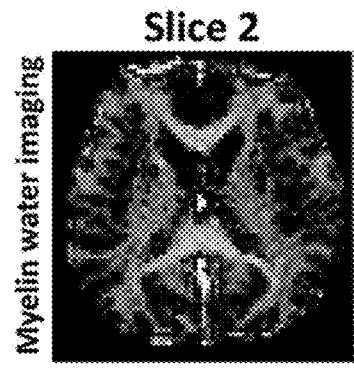
FIG. 4D shows a nerve myelin sheath concentration map for slice 2, obtained from nerve myelin sheath water imaging.
Figure 5:
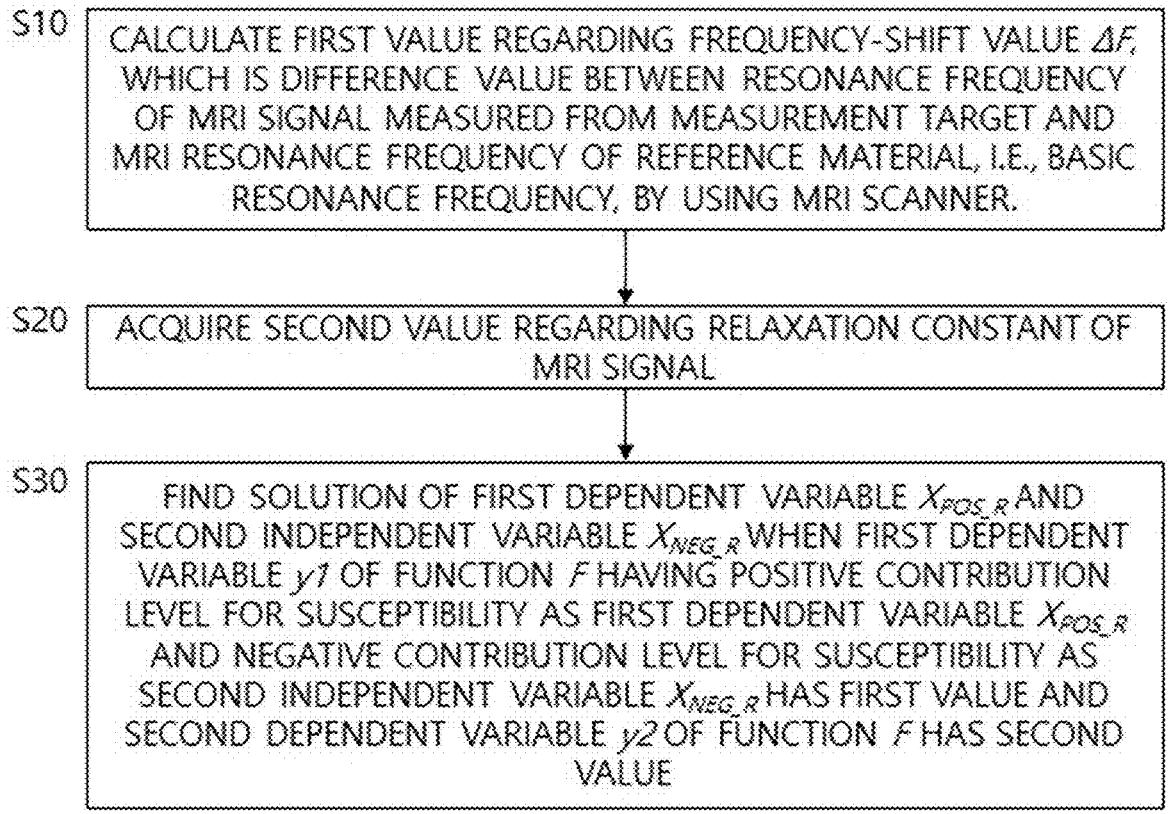
FIG. 5 is a flowchart illustrating an MRI data processing method according to an embodiment of the present invention.

FIG. 5 is a flowchart illustrating an MRI data processing method according to an embodiment of the present invention.

Figure 7:
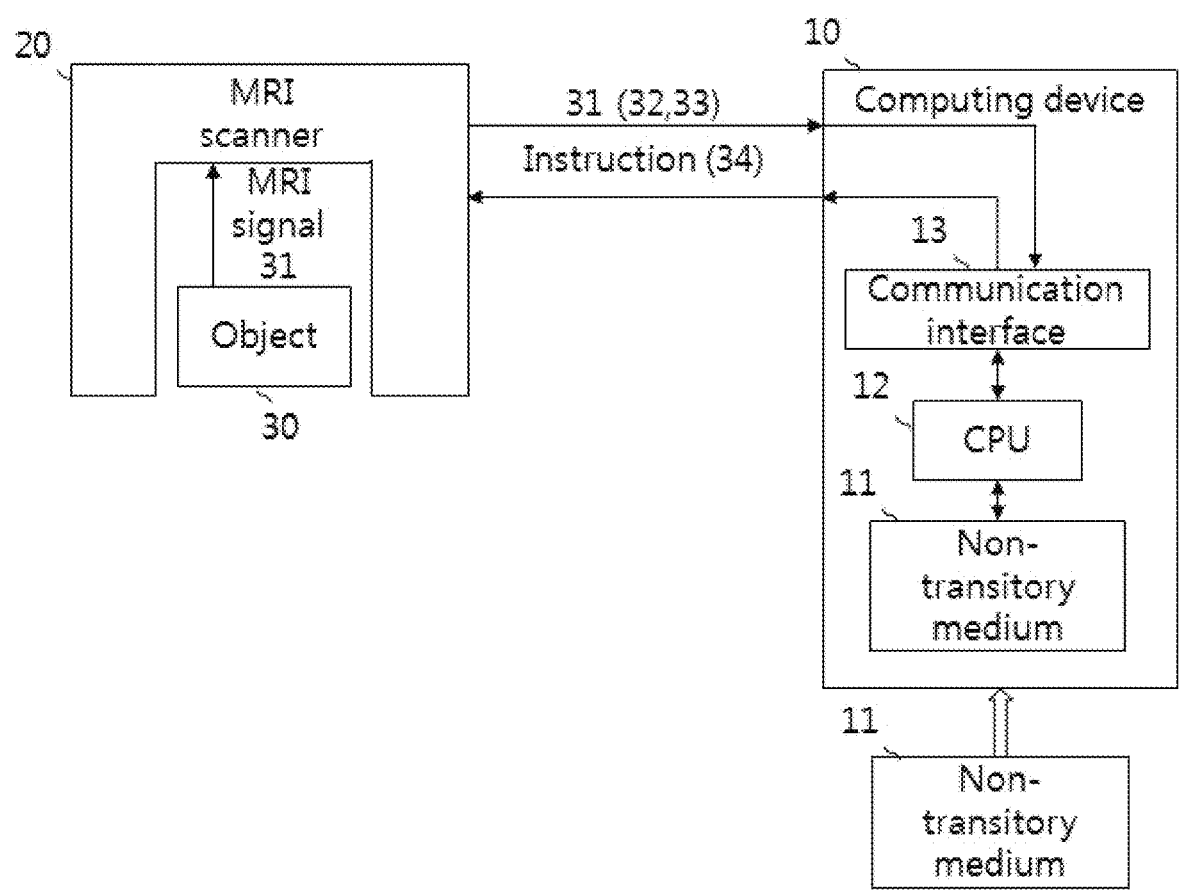
FIG. 7 shows a configuration of an MRI data processing system according to an embodiment of the present invention.

FIG. 7 shows a configuration of an MRI data processing system according to an embodiment of the present invention.

Hereinafter, this will be described with reference to FIGS. 5 and 7.

The MRI data processing method determines the positive contribution level ($\chi_{pos\_R}$) for susceptibility by more than one or more different materials with susceptibility greater than the susceptibility ($\chi(M_R)$) of the reference material ($M_R$) and the negative contribution level ($\chi_{neg\_R}$) for susceptibility by one or more different materials with susceptibility smaller than the susceptibility of the reference material.

The MRI data processing method may include the following operation S10 to operation S30.

In operation S10, the computing device 10 may calculate a first value regarding frequency-shift value Δf, which is a difference value between the resonance frequency 32 of the MRI signal 31 measured from the measurement target 30 and the MRI resonance frequency of the reference material, i.e., the basic resonance frequency, by using the MRI scanner.

In operation S20, the computing device 10 may acquire a second value regarding the relaxation constant 33 of the MRI signal 31.

In operation S30, the computing device 10 may find the solution of the first independent variable $\chi_{pos\_R}$ and the second independent variable $\chi_{neg\_R}$ when the first dependent variable y1 of the function F having the positive contribution level for susceptibility as the first dependent variable $\chi_{pos\_R}$ and the negative contribution level for susceptibility as the second independent variable $\chi_{neg\_R}$ has the first value and the second dependent variable y2 of the function F has the second value.

To this end, the computing device 10 may control the MRI apparatus (or MRI scanner) 20 for measuring the MRI signal by using the instruction 34. In addition, the computing device 10 may receive the MRI signal 31 from the MRI apparatus 20. The computing device 10 may be provided as a part of the MRI apparatus 20 or may be a device connected to the MRI apparatus 20 but provided separately.

At this time, the function F may be given as (y1, y2)=F($\chi_{pos\_R}$, $\chi_{neg\_R}$).

In this case, the first value may be the frequency-shift value, and the second value may be any one of R2, R2', and R2*.

At this time, the function F may include a first function f1 having the first independent variable $\chi_{pos\_R}$ and the second independent variable $\chi_{neg\_R}$ as independent variables and having the first dependent variable y1 as a dependent variable, and a second function f2 having the first independent variable $\chi_{pos\_R}$ and the second independent variable $\chi_{neg\_R}$ as independent variables and having the second dependent variable y2 as a dependent variable.

Then, a relationship between the first function f1, the first dependent variable y1, the first independent variable $\chi_{pos\_R}$, and the second independent variable $\chi_{neg\_R}$ is given as equation 19, and a relationship between the second function f2, the second dependent variable y2, the first independent variable $\chi_{pos\_R}$, and the second independent variable $\chi_{neg\_R}$ may be given as equation 20.

$$y1 = f1(\chi_{pos\_R}, \chi_{neg\_R}) \quad \text{[Equation 19]}$$

$$y2 = f2(\chi_{pos\_R}, \chi_{neg\_R}) \quad \text{[Equation 20]}$$

At this time, the relationship between the second function f2, the second dependent variable y2, the first independent variable $\chi_{pos\_R}$, and the second independent variable $\chi_{neg\_R}$ may be given as equation 21.

$$y2 = f2(|\chi_{pos\_R}|, |\chi_{neg\_R}|) \quad \text{[Equation 21]}$$

At this time, it is conceivable that one or more different materials with greater susceptibility include p-type first domain materials ($M_{p,a}$, a=1, 2, 3, . . . , p) and one or more different materials having smaller susceptibility include q-type second domain materials ($M_{n,b}$, b=1, 2, 3, . . . , q). At this time, the positive contribution level for susceptibility $\chi_{pos\_R}$ and the negative contribution level for susceptibility $\chi_{neg\_R}$ may be given as equation 22 and equation 23, respectively.

$$X_{pos\_R} \overset{p}{\underset{a=1}{Q}} = \chi_R(M_{p,a}) * \rho(M_{p,a}), \quad \text{[Equation 22]}$$
$$a = 1, 2, 3, \ldots, p$$

$$X_{neg\_R} \overset{q}{\underset{b=1}{Q}} = \chi_R(M_{n,b}) * \rho(M_{n,b}), \quad \text{[Equation 23]}$$
$$b = 1, 2, 3, \ldots, q$$

where, $\chi_R(M_{p,a})$ is a value obtained by subtracting the susceptibility $\chi(M_R)$ of the reference material from the susceptibility $\chi(M_{p,a})$ of the first domain material ($M_{p,a}$), $\chi_R(M_{n,b})$ is a value obtained by subtracting the susceptibility $\chi(M_R)$ of the reference material from the susceptibility $\chi(M_{n,b})$ of the second domain material ($M_{n,b}$), $\rho(M_{p,a})$ is the density of the first domain material ($M_{p,a}$), and $\rho(M_{n,b})$ is the density of the second domain material ($M_{n,b}$).

Embodiment 2

Figure 6:
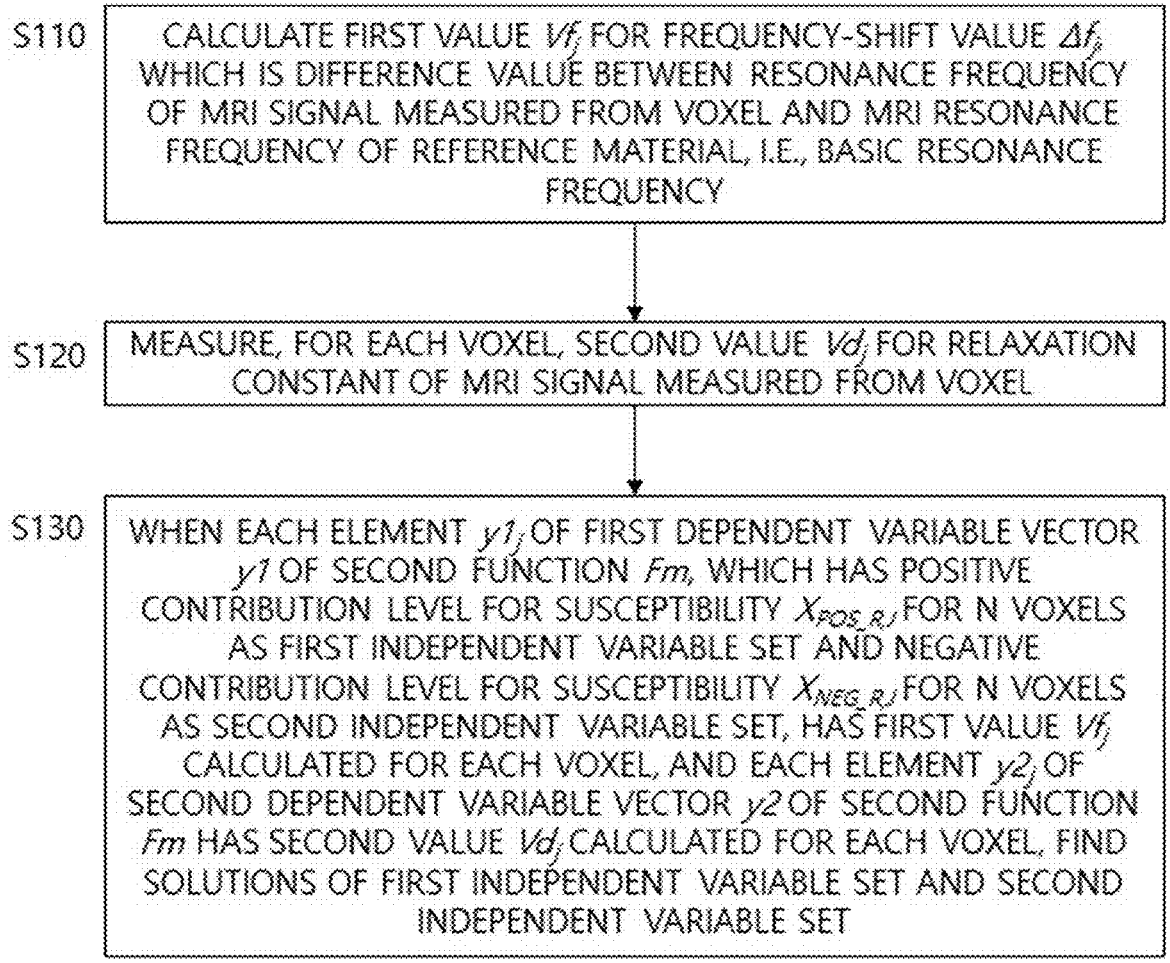
FIG. 6 is a flowchart illustrating an MRI data processing method according to another embodiment of the present invention.

FIG. 6 is a flowchart illustrating an MRI data processing method according to another embodiment of the present invention. Hereinafter, this will be described with reference to FIGS. 6 and 7.

According to another embodiment of the present invention, a method for processing MRI data determines the positive contribution level for susceptibility $\chi_{pos\_R}$ by one or more different materials with susceptibility greater than the susceptibility $\chi(M_R)$ of the reference material $M_R$ and the negative contribution level for susceptibility $\chi_{neg\_R}$ by one or more different materials with susceptibility smaller than the susceptibility of the reference material, for each of the N voxels of the measurement target. This method may include the following operation S110 to operation S130.

In operation S110, the computing device 10 may calculate, for each voxel, a first value $Vf_j$ for frequency-shift value $\Delta f_j$, which is a difference value between the resonance frequency of the MRI signal measured from the voxel and the MRI resonance frequency of the reference material, i.e., the basic resonance frequency.

In operation S120, the computing device may measure, for each voxel, a second value $Vd_j$ for a relaxation constant of the MRI signal measured from the voxel.

In operation S130, when each element $y1_j$ of the first dependent variable vector y1 of the second function Fm, which has the positive contribution level for susceptibility $\chi_{pos\_R,j}$ for the N voxels as a first independent variable set and the negative contribution level for susceptibility $\chi_{neg\_R,j}$ for the N voxels as a second independent variable set, has the first value $Vf_j$ calculated for each voxel, and each element $y2_j$ of the second dependent variable vector y2 of the second function Fm has the second value $Vd_1$ calculated for each voxel, the computing device may find the solutions of the first independent variable set and the second independent variable set. Here, j=1, 2, 3, . . . , N.

At this time, the second function Fm may be given as (y1, y2)=Fm($\chi_{pos\_R,1}$, $\chi_{pos\_R,2}$, $\chi_{pos\_R,3}$, . . . , $\chi_{pos\_R,N}$, $\chi_{neg\_R,1}$, $\chi_{neg\_R,2}$, $\chi_{neg\_R,3}$, . . . , $\chi_{neg\_R,N}$).

And, the first dependent variable vector and the second dependent variable vector may be expressed as follows.

$$y1 = (y1_1, y1_2, y1_3, \ldots, y1_N)$$

$$y2 = (y2_1, y2_2, y2_3, \ldots, y2_N)$$

In this case, the first value $Vf_j$ may be the frequency-shift value $\Delta f_j$, and the second value $Vd_j$ may be any one of R2, R2', and R2*.

At this time, the second function Fm includes a first function Fm1 having the first independent variable set $\chi_{pos\_R,j}$ and the second independent variable set $\chi_{neg\_R,j}$ as independent variables and having the first dependent variable y1 as a dependent variable, and a second function Fm2 having the first independent variable $\chi_{pos\_R,j}$ and the second independent variable $\chi_{neg\_R,j}$ as independent variables and having the second dependent variable y2 as a dependent variable.

Then, the relationship between the first function Fm1, the first dependent variable vector y1, the first independent variable set $\chi_{pos\_R,j}$, and the second independent variable set $\chi_{neg\_R,j}$ may be given as equation 24.

Then, the relationship between the second function Fm2, the second dependent variable vector y2, the first independent variable set $\chi_{pos\_R,j}$, and the second independent variable set $\chi_{neg\_R,j}$ may be given as equation 25.

$$y1 = Fm1(\chi_{pos\_R,1}, \chi_{pos\_R,2}, \chi_{pos\_R,3}, \ldots, \chi_{pos\_R,N},$$
$$\chi_{neg\_R,1}, \chi_{neg\_R,2}, \chi_{neg\_R,3}, \ldots, \chi_{neg\_R,N}) \quad \text{[Equation 24]}$$

$$y2 = Fm2(\chi_{pos\_R,1}, \chi_{pos\_R,2}, \chi_{pos\_R,3}, \ldots, \chi_{pos\_R,N},$$
$$\chi_{neg\_R,1}, \chi_{neg\_R,2}, \chi_{neg\_R,3}, \ldots, \chi_{neg\_R,N}) \quad \text{[Equation 25]}$$

At this time, then, the relationship between the second function Fm2, the second dependent variable vector y2, the first independent variable set $\chi_{pos\_R,j}$, and the second independent variable set $\chi_{neg\_R,j}$ may be given as equation 26.

$$y2 = Fm2(|\chi_{pos\_R,1}|, |\chi_{pos\_R,2}|, |\chi_{pos\_R,3}|, \ldots,$$
$$|\chi_{pos\_R,N}|, |\chi_{neg\_R,1}|, |\chi_{neg\_R,2}|, |\chi_{neg\_R,3}|, \ldots,$$
$$|\chi_{neg\_R,N}|) \quad \text{[Equation 26]}$$

At this time, it is conceivable that one or more different materials with greater susceptibility include p-type first domain materials ($M_{p,a}$, a=1, 2, 3, ..., p) and one or more different materials having smaller susceptibility include q-type second domain materials ($M_{n,b}$, b=1, 2, 3, ..., q). At this time, the positive contribution level for susceptibility $\chi_{pos\_R,j}$ for each voxel and the negative contribution level for susceptibility $\chi_{neg\_R,j}$ for each voxel may be given as equation 27 and equation 28, respectively.

$$X_{pos\_R,j} \overset{p}{\underset{a=1}{Q}} = \chi_R(M_{p,a}) * \rho_j(M_{p,a}), \quad \text{[Equation 27]}$$
$$a = 1, 2, 3, \ldots, p$$

$$X_{neg\_R,j} \overset{q}{\underset{b=1}{Q}} = \chi_R(M_{n,b}) * \rho_j(M_{n,b}), \quad \text{[Equation 28]}$$
$$b = 1, 2, 3, \ldots, q$$

where, $\chi_R(M_{p,a})$ is a value obtained by subtracting the susceptibility $\chi(M_R)$ of the reference material from the susceptibility $\chi(M_{p,a})$ of the first domain material ($M_{p,a}$), $\chi_R(M_{n,b})$ is a value obtained by subtracting the susceptibility $\chi(M_R)$ of the reference material from the susceptibility $\chi(M_{n,b})$ of the second domain material ($M_{n,b}$), $\rho_j(M_{p,a})$ is the density of the first domain material $M_{p,a}$ at voxel j, and $\rho_j(M_{n,b})$ is the density of the second domain material $M_{n,b}$ at voxel j.

Embodiment 3

According to an embodiment of the present invention, a computing device for processing MRI data may be provided. This device may determine the positive contribution level for susceptibility $\chi_{pos\_R}$ by one or more different materials with susceptibility greater than the susceptibility $\chi(M_R)$ of the reference material $M_R$ and the negative contribution level for susceptibility $\chi_{neg\_R}$ by one or more different materials with susceptibility smaller than the susceptibility of the reference material.

The computing device may be configured to calculate a first value regarding the frequency of the MRI signal of the measurement target, obtain a second value regarding a relaxation constant of the MRI signal, and find the solutions of the first independent variable $\chi_{pos\_R}$ and the second independent variable $\chi_{neg\_R}$ when the first dependent variable y1 of the function F having the positive contribution level for susceptibility as a first independent variable $\chi_{pos\_R}$ and the negative contribution level for susceptibility as a second independent variable $\chi_{neg\_R}$ has the first value and the second dependent variable y2 of the function F has the second value.

The computing device may be provided integrally with the MRI apparatus for measuring the MRI measurement target or may be provided separately from the MRI apparatus.

At this point, the first value regarding the frequency of the MRI signal of the measurement target is a frequency-shift value Δf, which is a difference value between the resonance frequency of the MRI signal measured from the measurement target and the basic resonance frequency, i.e., the MRI resonance frequency of the reference material.

Embodiment 4

According to another embodiment of the present invention, provided is a computer-readable recording medium 11 having a program recorded thereon to cause the computing device 10 to determine the positive contribution level for susceptibility $\chi_{pos\_R}$ by one or more different materials with susceptibility greater than the susceptibility $\chi(M_R)$ of the reference material $M_R$ and the negative contribution level for susceptibility $\chi_{neg\_R}$ by one or more different materials with susceptibility smaller than the susceptibility of the reference material.

The program may be executed to perform operations of calculating a first value regarding the frequency of the MRI signal of the measurement target, obtaining a second value regarding a relaxation constant of the MRI signal, and finding the solutions of the first independent variable $\chi_{pos\_R}$ and the second independent variable $\chi_{neg\_R}$ when the first dependent variable y1 of the function F having the positive contribution level for susceptibility as a first independent variable $\chi_{pos\_R}$ and the negative contribution level for susceptibility as a second independent variable $\chi_{neg\_R}$ has the first value and the second dependent variable y2 of the function F has the second value.

At this point, the first value regarding the frequency of the MRI signal of the measurement target is a frequency-shift value Δf, which is a difference value between the resonance frequency of the MRI signal measured from the measurement target and the basic resonance frequency, i.e., the MRI resonance frequency of the reference material.

The program may further include a code for causing the computing device 10 to execute each operation shown in the above-described embodiments 1 and 2.

The computer-readable recording medium 11 may be an HDD or an SDD installed in the computing device 10, or may be provided in various forms such as a USB memory, an SD memory card readable by the computing device 10, and the like. The CPU 12 may read the program from the computer-readable recording medium 11 readable by the computer and execute the program. The instruction from the CPU 12 and the MRI signal from the MRI scanner 20 may be exchanged through the communication interface 13 of the computing device 10. The resultant value calculated by the CPU 12 through the execution of the program may be stored in the computer-readable recording medium 11 or may be outputted through another output interface.

According to the present invention, it is possible to provide data to distinguish information on the distribution of materials with susceptibility greater than the susceptibility of a predetermined reference material and information on the distribution of material with susceptibility lower than the susceptibility of the reference material among the various materials included in the measurement target.

It will be apparent to those skilled in the art that various modifications and variations may be made in the present invention without departing from the spirit or essential characteristics thereof. The contents of each claim may be combined with other claims without departing from the scope of the claims.

What is claimed is:

1. An MRI data processing method for determining a positive contribution level ($\chi_{pos\_R}$) for susceptibility due to a first material set of one or more different materials, each material included in the first material set having a susceptibility larger than a susceptibility ($\chi(M_R)$) of a reference material ($M_R$), respectively, and a negative contribution level ($\chi_{neg\_R}$) for susceptibility due to a second material set of one or more different materials, each material included in the second material set having a susceptibility smaller than the susceptibility of the reference material, comprising:

calculating, with an MRI scanner or a computing device associated with the MRI scanner, a first value regarding a frequency of a MRI signal obtained by the MRI scanner from a measurement target;

acquiring, with the MRI scanner, a second value regarding a relaxation constant of the MRI signal;

determining, with the MRI scanner or the computing device associated with the MRI scanner, a value of a first independent variable of a function (F) and a second independent variable of the function; and providing, with the MRI scanner or the computing device associated with the MRI scanner, at least one of a first susceptibility map for display based on the determined first independent variable and a second susceptibility map based on the determined second independent variable, wherein, the determining is performed under a condition that:

the first independent variable is set to the positive contribution level ($\chi_{pos\_R}$), the second independent variable is set to the negative contribution level ($\chi_{neg\_R}$), a first dependent variable (y1) of the function is set to the first value, and a second dependent variable (y2) of the function is set to the second value.

2. The MRI data processing method of claim 1, wherein, the first value is a value regarding a frequency-shift value ($\Delta f$), the frequency-shift value is a difference value between a resonance frequency of the MRI signal and a reference resonance frequency, and the reference resonance frequency is a MRI resonance frequency of the reference material.

3. The MRI data processing method of claim 2, wherein the first value is the frequency-shift value and the second value is any one of R2, R2', and R2*, wherein R2 represents an original signal relaxation rate of a material in the MRI scanner, R2* represents a signal relaxation rate of the material when magnetic field in the material is non-uniform in the MRI scanner, and R2' represents R2* minus R2.

4. The MRI data processing method of claim 1, wherein the function (F) comprises:

a first function (f1) having the first independent variable ($\chi_{pos\_R}$) and the second independent variable ($\chi_{neg\_R}$) as independent variables and having the first dependent variable (y1) as a dependent variable, and a second function (f2) having the first independent variable ($\chi_{pos\_R}$) and the second independent variable ($\chi_{neg\_R}$) as independent variables and having the second dependent variable (y2) as a dependent variable, wherein a relationship between the first function (f1), the first dependent variable (y1), the first independent variable ($\chi_{pos\_R}$), and the second independent variable ($\chi_{neg\_R}$) is given as equation 1, and a relationship between the second function (f2), the second dependent variable (y2), the first independent variable ($\chi_{pos\_R}$), and the second independent variable ($x_{neg\_R}$) is given as equation 2, $$y1 = f1(\chi_{pos\_R}, \chi_{neg\_R}) \quad \text{[Equation 1]}$$

$$y2 = f2(\chi_{pos\_R}, \chi_{neg\_R}) \quad \text{[Equation 2]}$$

5. The MRI data processing method of claim 4, wherein the relationship between the second function (f2), the second dependent variable (y2), the first independent variable ($\chi_{pos\_R}$), and the second independent variable ($\chi_{neg\_R}$) is given as equation 3, $$y2 = f2(|\chi_{pos\_R}|, |\chi_{neg\_R}|) \quad \text{[Equation 3]}$$

6. The MRI data processing method of claim 1, wherein, when the first material set includes first domain materials ($M_{p,a}$, a=1, 2, 3, ... p) of p number of types, and the second material set includes second domain materials ($M_{n,b}$, b=1, 2, 3, ... q) of q number of types, the positive contribution level ($\chi_{pos\_R}$) is given as equation 4, and the negative contribution level ($\chi_{neg\_R}$) is given as equation 5, $$\chi_{pos\_R} = \overset{p}{\underset{a=1}{Q}} \chi_R(M_{p,a}) * \rho(M_{p,a}), \quad \text{[Equation 4]}$$

$$a = 1, 2, 3, \ldots, p$$

$$\chi_{neg\_R} = \overset{q}{\underset{b=1}{Q}} \chi_R(M_{n,b}) * \rho(M_{n,b}), \quad \text{[Equation 5]}$$

$$b = 1, 2, 3, \ldots, q$$

$\chi_R(M_{p,a})$ is a value obtained by subtracting the susceptibility ($\chi(M_R)$) of the reference material from a susceptibility ($\chi(M_{p,a})$) of a first domain material ($M_{p,a}$), $\chi_R(M_{n,b})$ is a value obtained by subtracting the susceptibility ($\chi(M_R)$) of the reference material from a susceptibility ($\chi(M_{n,b})$) of a second domain material ($M_{n,b}$), $\rho(M_{p,a})$ is a density of the first domain material ($M_{p,a}$, and $\rho(M_{n,b})$ is a density of the second domain material ($M_{n,b}$).

7. An MRI data processing method for determining a positive contribution level ($\chi_{pos\_R}$) for susceptibility due to a first material set of one or more different materials, each material included in the first material set having a susceptibility larger than a susceptibility ($\chi(M_R)$) of a reference material ($M_R$), respectively, and a negative contribution level ($\chi_{neg\_R}$) for susceptibility due to a second material set of one or more different materials, each material included in the second material set having a susceptibility smaller than the susceptibility of the reference material, for each of N number of voxels of a measurement target, comprising:

for each of the voxels, calculating, with an MRI scanner or a computing device associated with the MRI scanner, a first value ($Vf_j$) regarding a frequency of a MRI signal obtained by the MRI scanner from the voxel;

for each of the voxels, acquiring, with the MRI scanner, a second value ($Vd_j$) regarding a relaxation constant of the voxel; and determining, with the MRI scanner or the computing device associated with the MRI scanner, a value of a first independent variable set of a second function (Fm) and a second independent variable set of the second function; and providing, with the MRI scanner or the computing device associated with the MRI scanner, at least one of a first susceptibility map for display based on the determined first independent variable set and a second susceptibility map based on the determined second independent variable set, wherein, the determining is performed under a condition that:

the first independent variable set is set to the positive contribution levels ($\chi_{pos\_R}$) of the N number of voxels, the second independent variable set is set to the negative contribution level ($\chi_{neg\_R}$) of the N number of voxels, each element ($y1_j$) of a first dependent variable vector (y1) of the second function is set to the first value ($Vf_j$) calculated for the each voxel, respectively, and each element ($y2_j$) of a second dependent variable vector (y2) of the second function is set to the second value ($Vd_j$) calculated for the each voxel, respectively $j = 1, 2, 3, \ldots, N$.

8. The MRI data processing method of claim 7, wherein a first value ($Vf_j$) regarding a frequency of the MRI signal measured from the voxel is a value regarding a frequency-shift value ($\Delta f_j$), which is a difference value between the resonance frequency of the MRI signal measured from the voxel and a basic resonance frequency which is a MRI resonance frequency of the reference material.

9. The MRI data processing method of claim 7, wherein the second function (Fm) is given as (y1, y2)=Fm($\chi_{pos\_R,1}$, $\chi_{pos\_R,2}$, $\chi_{pos\_R,3}$, ..., $\chi_{pos\_R,N}$, $\chi_{neg\_R,1}$, $\chi_{neg\_R,2}$, $\chi_{neg\_R,3}$, ..., $\chi_{neg\_R,N}$).

10. The MRI data processing method of claim 7, wherein the first value ($Vf_j$) is the frequency-shift value ($\Delta f_j$), and the second value ($Vd_j$) is any one of R2, R2', and R2*, wherein R2 represents an original signal relaxation rate of a material in the MRI scanner, R2* represents a signal relaxation rate of the material when magnetic field in the material is non-uniform in the MRI scanner, and R2' represents R2* minus R2.

11. The MRI data processing method of claim 7, wherein the second function (Fm) comprises:

a first function (Fm1) having the first independent variable set ($\chi_{pos\_R,j}$) and the second independent variable set ($\chi_{neg\_R,j}$) as independent variables and having the first dependent variable (y1) as a dependent variable, and a second function (Fm2) having the first independent variable ($\chi_{pos\_R,j}$) and the second independent variable ($\chi_{neg\_R,j}$) as independent variables and having the second dependent variable (y2) as a dependent variable, wherein a relationship between the first function (Fm1), the first dependent variable vector (y1), the first independent variable set ($\chi_{pos\_R,j}$), and the second independent variable set ($\chi_{neg\_R,j}$) is be given as equation 6, and a relationship between the second function (Fm2), the second dependent variable vector (y2), the first independent variable set ($\chi_{pos\_R,j}$), and the second independent variable set ($\chi_{neg\_R,j}$) is given as equation 7, $$y1 = Fm1(\chi_{pos\_R,1}, \chi_{pos\_R,2}, \chi_{pos\_R,3}, \ldots, \chi_{pos\_R,N}, \chi_{neg\_R,1}, \chi_{neg\_R,2}, \chi_{neg\_R,3}, \ldots, \chi_{neg\_R,N})$$ [Equation 6]

$$y2 = Fm2(\chi_{pos\_R,1}, \chi_{pos\_R,2}, \chi_{pos\_R,3}, \ldots, \chi_{pos\_R,N}, \chi_{neg\_R,1}, \chi_{neg\_R,2}, \chi_{neg\_R,3}, \ldots, \chi_{neg\_R,N})$$ [Equation 7]

12. The MRI data processing method of claim 7, wherein a relationship between the second function (Fm2), the second dependent variable vector (y2), the first independent variable set ($\chi_{pos\_R,j}$), and the second independent variable set ($\chi_{neg\_R,j}$) is given as equation 8, $$y2 = Fm2(|\chi_{pos\_R,1}|, |\chi_{pos\_R,2}|, |\chi_{pos\_R,3}|, \ldots, |\chi_{pos\_R,N}|, |\chi_{neg\_R,1}|, |\chi_{neg\_R,2}|, |\chi_{neg\_R,3}|, \ldots, |\chi_{neg\_R,N}|)$$ [Equation 8]

13. The MRI data processing method of claim 7, wherein when the one or more different materials with greater susceptibility comprise p number of types of first domain materials ($M_{p,a}$, a=1, 2, 3, ..., p) and the one or more different materials having smaller susceptibility comprise q number of types of second domain materials ($M_{n,b}$, b=1, 2, 3, ..., q), a positive contribution level ($\chi_{pos\_R,j}$) for susceptibility for each voxel and a negative contribution level ($\chi_{neg\_R,j}$) for susceptibility for each voxel are given as equation 9 and equation 10, respectively, $$\chi_{pos\_R,j} \overset{p}{\underset{a=1}{Q}} = \chi_R(M_{p,a}) * \rho_j(M_{p,a}),$$ [Equation 9]

$$a = 1, 2, 3, \ldots, p$$

$$\chi_{neg\_R,j} \overset{q}{\underset{b=1}{Q}} = \chi_R(M_{n,b}) * \rho_j(M_{n,b}),$$ [Equation 10]

$$b = 1, 2, 3, \ldots, q$$

where, $\chi_R(M_{p,a})$ is a value obtained by subtracting the susceptibility ($\chi(M_R)$) of the reference material from the susceptibility ($\chi(M_{p,a})$) of the first domain material ($M_{p,a}$), $\chi_R(M_{n,b})$ is a value obtained by subtracting the susceptibility ($\chi(M_R)$) of the reference material from the susceptibility ($\chi(M_{n,b})$) of the second domain material, $\rho_j(M_{p,a})$ is a density of the first domain material ($M_{p,a}$) at the voxel j, and $\rho_j(M_{n,b})$ is a density of the second domain material ($M_{n,b}$) at the voxel j.

14. An MRI data processing system for processing MRI data to determine a positive contribution level ($\chi_{pos\_R}$) for susceptibility by more than one or more different materials with susceptibility greater than the susceptibility ($\chi(M_R)$) of the reference material ($M_R$) and a negative contribution level ($\chi_{neg\_R}$) for susceptibility by one or more different materials with susceptibility smaller than the susceptibility of the reference material comprising:

an MRI scanner; and a computing device associated with the MRI scanner; and wherein the computing device is configured to calculate, at the computing device, a first value regarding a frequency of an MRI signal obtained by the MRI scanner from a measurement target, to acquire, from the MRI scanner, a second value regarding a relaxation constant of the MRI signal, and to determine at the computing device, the solutions of the first independent variable ($\chi_{pos\_R}$) and the second independent variable ($\chi_{neg\_R}$) when a first dependent variable (y1) of a function (F) having the positive contribution level for susceptibility as a first independent variable ($\chi_{pos\_R}$) and the negative contribution level for susceptibility as a second independent variable ($\chi_{neg\_R}$) has the first value and a second dependent variable (y2) of the function (F) has the second value and to provide the MRI scanner with at least one of a first susceptibility map for display based on the found first independent variable and a second susceptibility map based on the found second independent variable.

15. The MRI data processing system of claim 14, wherein the first value regarding the frequency of the MRI signal of the measurement target is a frequency-shift value ($\Delta f$), which is a difference value between the resonance frequency of the MRI signal measured from the measurement target and a basic resonance frequency, which is a MRI resonance frequency of the reference material.

* * * * *